(12) United States Patent
Harris, Jr.

(10) Patent No.: US 7,306,975 B2
(45) Date of Patent: Dec. 11, 2007

(54) SEMICONDUCTOR WAFER CUTTING BLADE AND METHOD

(75) Inventor: John Paul Harris, Jr., Whitewright, TX (US)

(73) Assignee: Texas Instruments Incorporated, Dallas, TX (US)

( * ) Notice: Subject to any disclaimer, the term of this patent is extended or adjusted under 35 U.S.C. 154(b) by 253 days.

(21) Appl. No.: 11/172,975

(22) Filed: Jul. 1, 2005

(65) Prior Publication Data
US 2007/0004175 A1  Jan. 4, 2007

(51) Int. Cl.
*H01L 21/44* (2006.01)
(52) U.S. Cl. .................. 438/113; 438/460
(58) Field of Classification Search .......... 438/110, 438/113, 114, 460–465
See application file for complete search history.

(56) References Cited
U.S. PATENT DOCUMENTS
6,467,666 B2  10/2002  Ichikawa et al.
2005/0263854 A1*  12/2005  Shelton et al. .............. 257/615

* cited by examiner

*Primary Examiner*—Tuan H. Nguyen
(74) *Attorney, Agent, or Firm*—Yingsheng Tung; Wade James Brady, III; Frederick J. Telecky, Jr.

(57) ABSTRACT

The invention provides apparatus and methods for sawing and singulating individual devices from a silicon or glass-bonded semiconductor wafer. Using methods of the invention, wafer device singulation includes a step of sawing kerfs approximately coinciding with the peripheries of numerous devices arranged on a wafer. Kerfs are also sawn into the opposite side of the wafer approximately opposing the first kerfs. Mechanical stress is applied to the wafer causing controlled breakage of the intervening wafer material, severing each of the devices from its neighbors. A saw blade apparatus of the invention provides enhanced cutting characteristics and is particularly suited for glass-bonded semiconductor wafer device singulation. The saw blade has a diamond disc suitable for high-speed rotation about its axis. The saw blade of the invention also preferably has a radiused cutting edge, and an annular gutter symmetrically disposed about the circumference on each of the opposing planes of the disc.

17 Claims, 3 Drawing Sheets

SEMICONDUCTOR WAFER CUTTING BLADE AND METHOD

TECHNICAL FIELD

The invention relates to the manufacture of semiconductor devices. More particularly, the invention relates to apparatus and methods for sawing and singulating semiconductor wafers and wafer assemblies for the manufacture of semiconductor devices.

BACKGROUND OF THE INVENTION

It is well known to fabricate numerous semiconductor devices on a wafer and subsequently singulate the devices for final testing and packaging. Singulation may be accomplished by sawing, or by partial sawing combined with controlled breaking along the saw kerfs, also known as scribing and breaking. Generally, the wafer singulation process includes steps for aligning the wafer in a position for cutting, and then sawing through the wafer along prepared singulation or scribe streets according to predetermined die dimensions. The sawing is performed using a metallized or resin-bonded diamond saw blade rotating at a high speed. In some applications it is desirable to saw partially through one surface of the wafer or wafer assembly forming one or more saw kerfs, and then to saw one or more kerfs partially through the opposing surface. Once kerfs have been made around the periphery of the devices, the individual devices are singulated by applying pressure to fracture the material between the opposing kerfs. After singulation, the devices undergo further processing such as cleaning, testing, and packaging. Kerf width is defined as the average width of the cut, plus the error attributed to microchipping. Microchipping occurs at the wafer surface and at the edges of the kerf due to the abrasion of the sides of the saw blade. Microchipping may also occur at the bottom of the kerf, but is generally not a problem at this location. Microchipping at the edges of the kerf not only makes the kerf wider than it might otherwise be, but can also lead to further problems due to the propagation of cracks during sawing, during final singulation, or after singulation. These problems can lead to reduced density of devices on the wafer, production of devices that ultimately develop defects, and slower processing times.

Due to these and other problems related to sawing and microchipping, it would be beneficial to implement improved apparatus and methods for die singulation with improved sawing processes and techniques to reduce microchipping at the kerf edges. Further advantages could potentially be realized in the form of improved blade control, faster throughput, higher quality cuts, reduced waste, and longer blade life. Improved saw blades and methods adapted to provide one or more of these or similar benefits would be useful and advantageous in the arts.

SUMMARY OF THE INVENTION

In carrying out the principles of the present invention, in accordance with preferred embodiments thereof, the invention provides apparatus and methods for sawing and singulating individual devices from a semiconductor wafer.

According to an aspect of the invention, a preferred semiconductor device singulation method includes the step of, using a saw blade peculiar to the invention, sawing kerfs approximately coinciding with the peripheries of numerous devices arranged on a wafer. Kerfs are sawn into the opposite side of the wafer, also approximately coinciding with the peripheries of each of the of semiconductor devices. Mechanical stress is applied to the wafer causing controlled breakage of the intervening wafer material along the opposing kerfs, severing each of the devices from its neighbors.

According to another aspect of the invention, preferred embodiments include further steps for sawing parallel kerfs into glass layers of a glass-bonded wafer semiconductor wafer for device singulation.

According to further aspects of the invention, a saw blade for semiconductor device singulation includes a diamond disc suitable for high-speed rotation about its axis. The disc has an annular gutter symmetrically disposed about the circumference on each of the opposing planes of the disc.

According to further aspects of the invention, a saw blade for semiconductor wafer device singulation includes a radiused cutting edge. The degree of the radius may be selected based upon device, wafer, and process considerations.

The invention has advantages including but not limited to potential for improved throughput, higher density per wafer, higher yield, longer saw blade life, and decreased costs. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as first, second, top, bottom, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
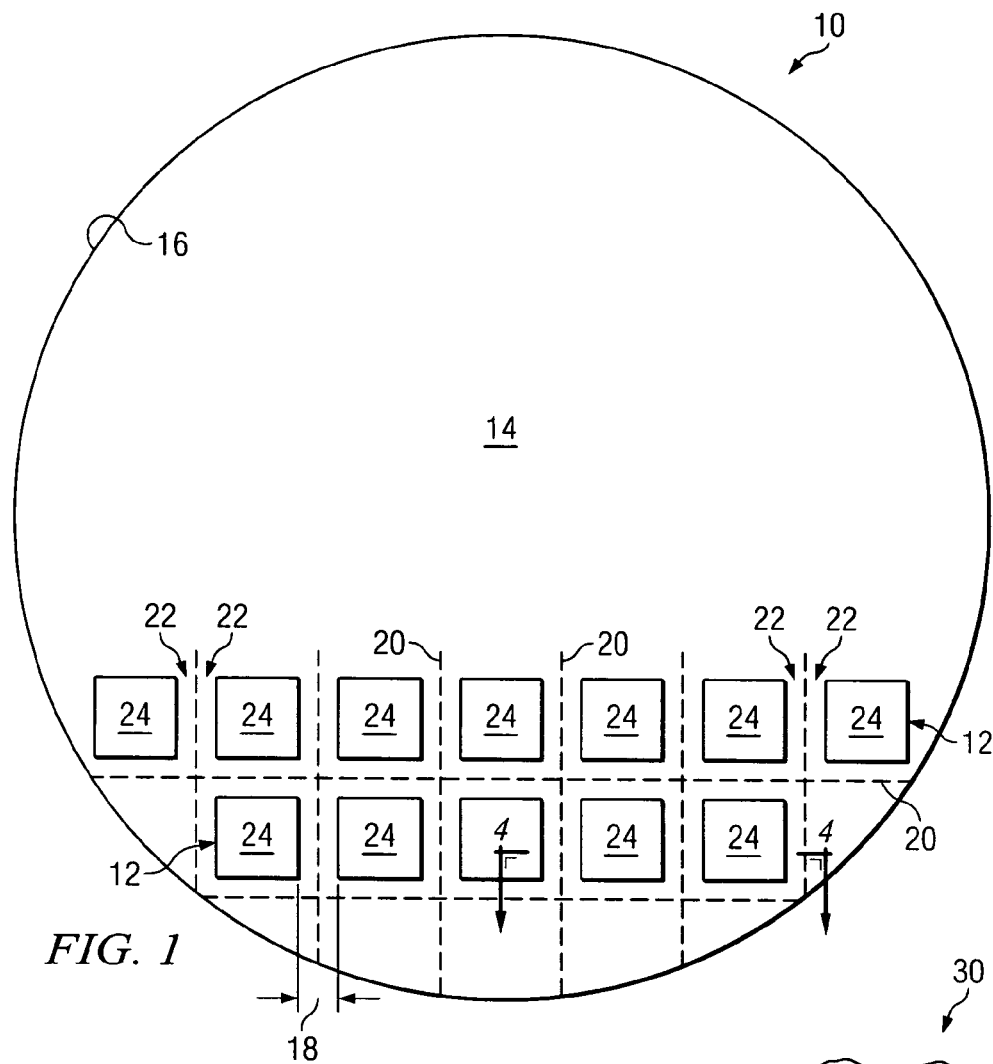
FIG. 1 is a top view of a glass-bonded semiconductor wafer with assembled unsingulated devices illustrating an example of steps in the methods of the invention.

Referring primarily to FIG. 1, a top view of a glass-bonded semiconductor wafer 10 is shown with numerous assembled unsingulated devices 12. Typically, upon completion of the fabrication of the individual devices 12, the wafer 10 surfaces 14, 16, are uniformly smooth. During fabrication, area 18 is provided between the devices 12 themselves, which typically includes area reserved for singulation, or scribe streets 20, and an inactive area 22 at the edges of each device 12 in order to provide a margin of future protection for the interior portion 24 of the device 12 during further processing and after singulation. The arrangement and number of devices shown provides those reasonably familiar with the arts a context and framework sufficient for the description of exemplary embodiments of methods and devices of the invention, and is not intended to be descriptive of any particular size, number, or arrangement of devices, nor of any specific wafer. Although a glass-bonded wafer is shown and described for the purposes of example, the invention may also be practiced with other types of semiconductor wafers such as silicon wafers or wafers comprised of more exotic semiconductor materials.

Figure 2:
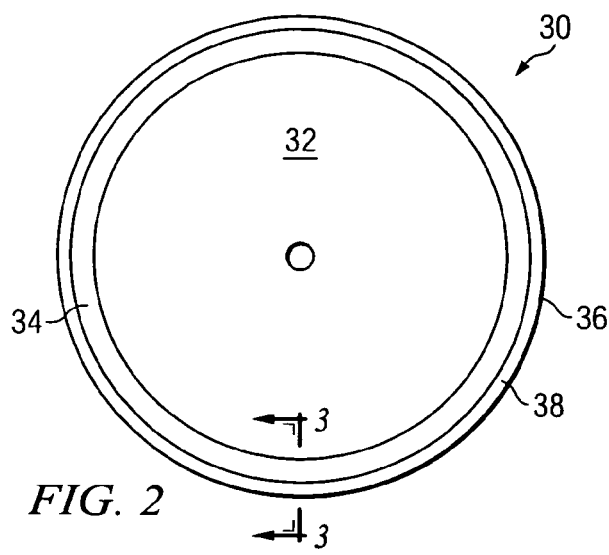
FIG. 2 is a side view of an example of a saw blade according to a preferred embodiment of the invention.
Figure 3:
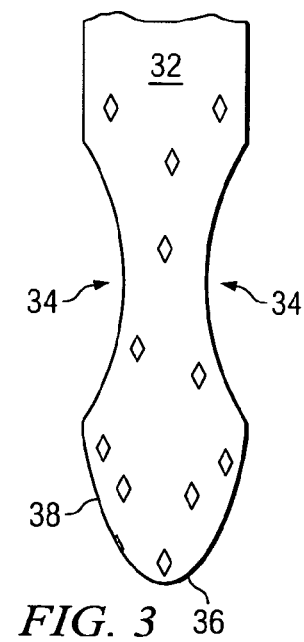
FIG. 3 is a partial cross section of the exemplary saw blade of FIG. 2 taken along line 3-3.

An example of a preferred embodiment of a saw blade 30 according to the invention is shown in FIGS. 2 and 3. FIG. 2 is a side view, and FIG. 3 is a partial cross-section of the exemplary saw blade of FIG. 2 taken along line 3-3. The saw blade 30 is preferably a resin-bonded diamond disc 32 of material familiar in the arts and suitable for high-speed rotation about its axis using common semiconductor processing machinery. In some applications, such as those using silicon wafers, a metallized diamond disc may alternatively be used. A gutter 34 is positioned on either side of the disc 32. The gutters 34 are annular in shape, and are situated near the cutting edge 36 of the disc 32 such that they may participate in sawing as shown and described herein. The depth of the gutters 34 may be varied without departure from the invention; in the presently preferred embodiment the gutter depth is about $\frac{1}{20}$ of the thickness of the disc. Typically, the gutter depth may be varied within the range of about 2% to about 10% of the disc thickness. In the presently preferred embodiment of the saw blade 30, a set-back 38 is provided between the gutters 34 and the cutting edge 36 of the disc 32.

The cutting edge 36 of the saw blade 30 is preferably radiused in order to increase cutting ability. The radius of the cutting edge 36 provides significant advantages in causing micro-cracks to concentrate at the bottom of the kerf 50, i.e., along the centerline of the saw blade 30. It has been found that saw blades made and used according to the invention with the radiused cutting edge 36 require less power for the same cutting conditions as compared to non-radiused blades. The term "radiused" is used herein to denote a generally rounded, parabolic, or wedge shaped edge. The degree of radius desirable is often a function of the blade thickness, material, and anticipated speed of operation. Other factors that may affect the selection of the degree of radius include wafer composition and thickness, device size, number of blades used in a given process, and the availability of sharpening processes and equipment. Typically, the trade-off is between a more acutely radiused disc providing improved cutting ability, and a more rounded radius providing increased durability.

Figure 4A:
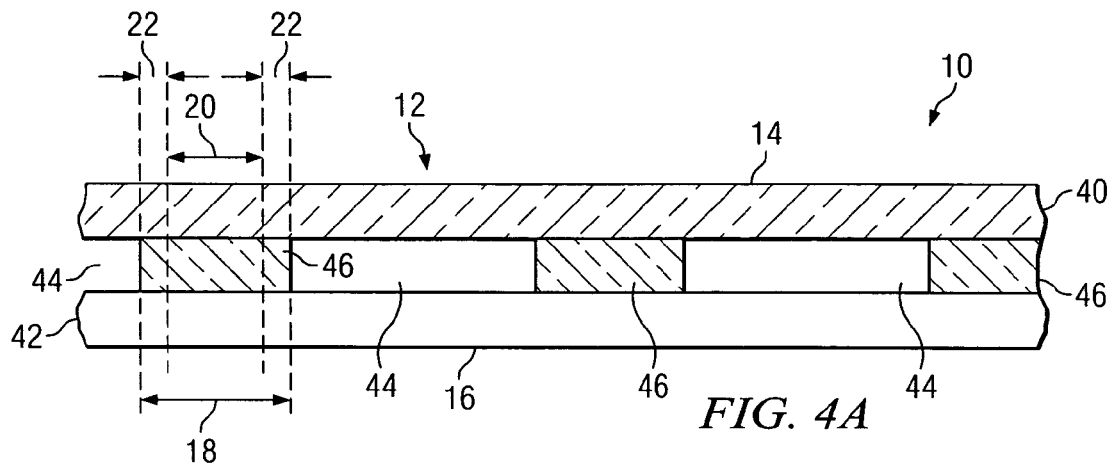
FIG. 4A is a cut-away partial side view of a glass-bonded semiconductor wafer with assembled unsingulated devices for use with a preferred embodiment of the invention.

FIG. 4A is a cut-away partial side view of the example of a glass-bonded semiconductor wafer 10 shown in FIG. 1, taken along line 4-4. One surface 14 of the wafer 10 is typically an outer glass layer 40, and the opposite surface 16 of the wafer 10 is the semiconductor substrate 42 upon which the device 12 is constructed according to processes not essential to the practice of the invention. In the example shown, the device 12 includes a sealed chamber 44 between the silicon layer 42 and outer glass layer 40. The outer glass layer 40 and the silicon substrate 42 layer in such a device 12 is typically separated by an inner glass layer 46 arranged to define the walls of the sealed chamber 44. Additional layers, partial layers, layer coatings, bonding materials, and other structures or features may also be used in the construction of the device 12, but are not germane to the understanding of the invention. Between individual devices 12, an area 18 includes scribe streets 20 designed to be sacrificed during sawing, and an inactive area 22 at the periphery of each device 12 reserved to protect the sealed chamber 44 of each device 12. Those skilled in the arts will note that the methods and tools described may also applied to the singulation process for wafers made from silicon or other semiconductor materials without departure from the invention, although the wafer and device structures may differ in detail.

Figure 4B:
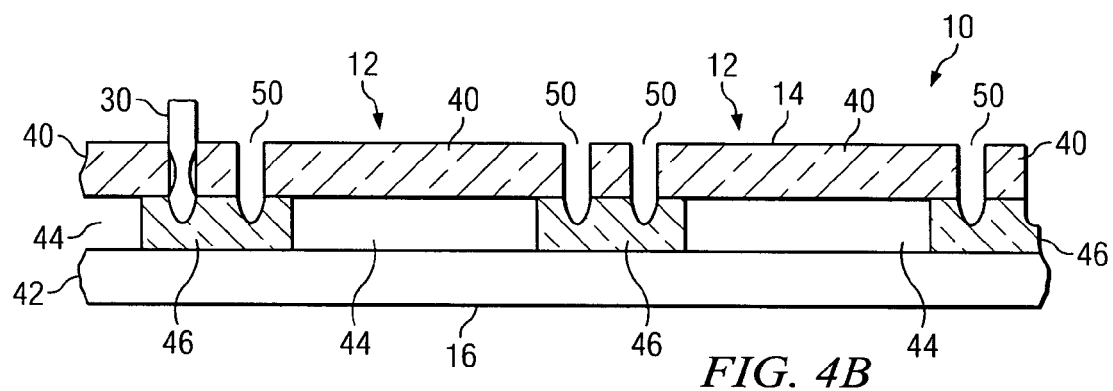
FIG. 4B is a cut-away partial side view of a glass-bonded semiconductor wafer with assembled unsingulated devices showing kerfs made in one surface according to a preferred embodiment of the invention.

Illustrating an exemplary embodiment of devices and methods of the invention, FIG. 4B is a cut-away partial side view of the glass-bonded semiconductor wafer 10 of FIG. 4A. A saw blade 30 having gutters 34 and a radiused cutting edge 36 is positioned for assisting in shaping the kerfs 50 is used to cut the outer glass layer 40 along the scribe streets 20 outlining the devices 12. Preferably, the kerfs 50 are sawn to a depth within the range of approximately $\frac{1}{3}$ to $\frac{3}{4}$ of the wafer 10 thickness, although other depths may be used as long as the kerfs 50 are sawn to a depth extending entirely through the outer glass layer 40 and partially through the inner glass layer 46.

The wafer 10 is held securely and presented to the saw blade 30 as known in the arts, but it should be understood that the saw blade 30 of the invention provides superior entry and exit characteristics over blades common in the arts. It has been found that the saw blade 30 of the invention meets reduced resistance when cutting, provides improved directional stability, and exhibits less tendency to transmit horizontal torque to the wafer 10. The gutters 34 reduce unwanted microchipping by reducing contact of the kerf 50 edges with the sides of the blade 30. The gutters 34 also provide a path for debris, further reducing abrasion on the edges of the kerf 50 and on the sides of the blade 30. The radiused cutting edge 36 of the saw blade 30 causes microchipping and microcracking at the bottom of the kerf 50, which increases the efficiency of cutting process.

Figure 4C:
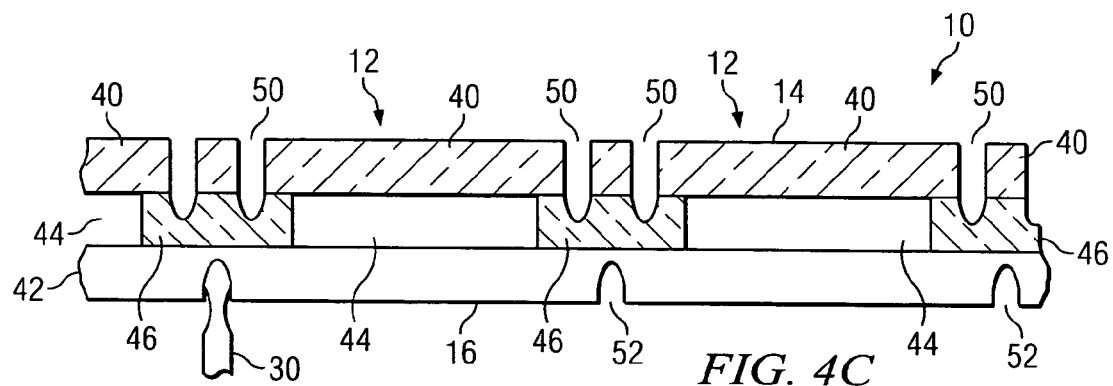
FIG. 4C is a cut-away partial side view of a glass-bonded semiconductor wafer with assembled unsingulated devices showing the kerfs of FIG. 4B and additional kerfs in the opposite surface of the wafer according to a preferred embodiment of the invention.
Figure 4D:
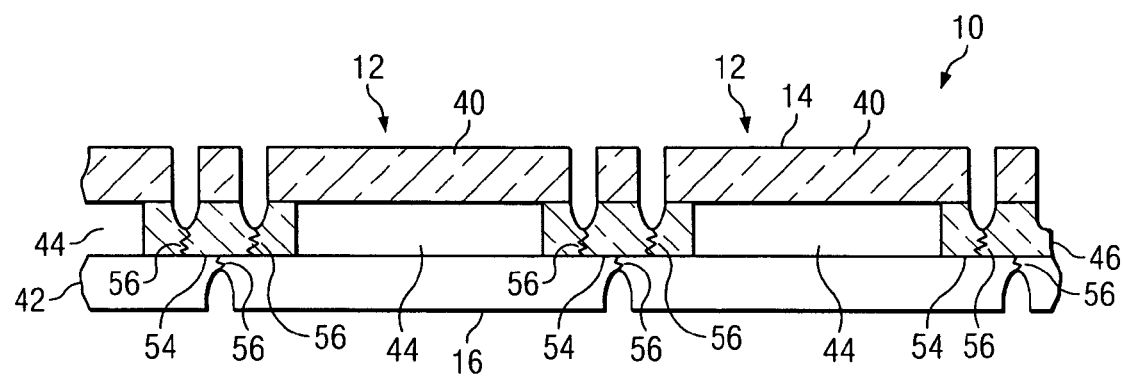
FIG. 4D is a cut-away partial side view of a glass-bonded semiconductor wafer with assembled unsingulated devices having opposing kerfs as in FIG. 4C, and additional controlled fractures between the kerfs for singulation of the individual devices according to a preferred embodiment of the invention.

Referring now primarily to FIG. 4C, a cut-away partial side view depicts further steps in the singulation methods of the invention. The semiconductor layer 42, is sawn to provide lower kerfs 52 opposite the upper kerfs 50 in the glass layers 40, 46. The kerfs 52 in the semiconductor layer 42 are preferably sawn to a depth about $\frac{1}{6}$ to $\frac{1}{4}$ of the thickness of the wafer 10, and preferably do not extend all the way through the semiconductor layer 42. In the presently preferred embodiment of the invention, two parallel kerfs 50 are used in the glass layers 40, 46, and one kerf 52 approximately centered between them is used in the silicon layer 42. As shown in FIG. 4D, this arrangement is useful for forming a shoulder 54, which may be used for providing exposed bond pads 56 in the singulated devices 12. With continued reference to FIG. 4D, mechanical stress is applied to the wafer 10 to induce controlled fracturing 56 in the material between the opposing kerfs 50, 52. Provided that the saw blade 30 of the invention is used to provide kerfs 50 in the outer glass layer 40 of the wafer 10, a standard blade known in the arts may be used to cut the opposing kerfs in the substrate layer without departure from the invention, although the use of the guttered and radiused saw blade 30 at both locations is presently preferred.

Figure 4E:
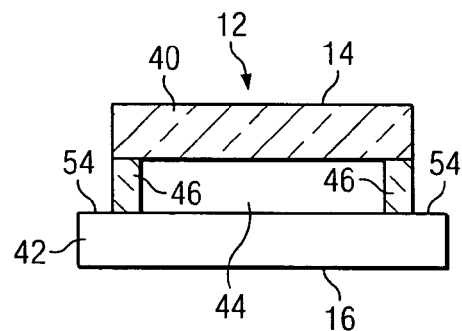
FIG. 4E is a partially cut-away side view of an example of a single glass-bonded semiconductor device singulated from a semiconductor wafer according to a preferred embodiment of the invention.

FIG. 4E is a partially cut-away side view of an example of a single glass-bonded semiconductor device 12 singulated from its neighbors on a semiconductor wafer 10 using preferred embodiments of the invention. The devices 12 are finally separated at the controlled fractures 56 produced in the material separating the opposing kerfs 50, 52. As shown, the kerfs e.g., 50, 52, may be arranged to provide a shoulder 54 in order to facilitate the exposure of contact points for making electrical connections to the device 12. A waste portion, primarily glass and sometimes denominated a "swizzle stick" may be produced by the fracturing step, and is disposed of as the severed device 12 continues to be processed, e.g., cleaned, tested, packaged, as is known in the arts.

The methods and apparatus of the invention present advantages including but not limited to, providing saw blades with improved cutting ability, improved controllability, and a longer useful life, improved methods for singulating devices reduce unwanted microchipping and increase throughput. While the invention is described with reference to certain illustrative embodiments, the embodiments described herein are not intended to be construed in a limiting sense. Various modifications and combinations of the illustrative embodiments as well as other advantages and embodiments of the invention will be apparent to persons skilled in the arts upon reference to the drawings, description, and claims.

I claim:

1. A semiconductor device singulation method comprising the steps of:
    sawing one or more first kerfs into a planar surface of a prepared wafer, using a saw blade having a radiused cutting edge;
    the one or more first kerfs arranged in a pattern approximately coinciding with the peripheries of each of a plurality of neighboring semiconductor devices arranged on the wafer;
    sawing one or more second kerfs into the opposite planar surface of the wafer, the one or more second kerfs also approximately coinciding with the peripheries of each of the plurality of semiconductor devices, wherein the first and second kerfs approximately oppose one another across the intervening wafer material;
    applying mechanical stresses to the wafer at the intervening wafer material for causing controlled breakage of the intervening wafer material along the approximately opposing first and second kerfs, thereby severing each of the devices from its neighbors.

2. A semiconductor device singulation method according to claim 1, wherein at least one of the sawing steps is performed using a saw blade having annular gutters.

3. A semiconductor device singulation method according to claim 1, wherein the prepared wafer comprises a glass-bonded wafer.

4. A semiconductor device singulation method according to claim 3, wherein a step of sawing kerfs into a planar surface of the wafer further comprises sawing two parallel kerfs in the glass layer.

5. A semiconductor device singulation method according to claim 1, wherein one surface of the wafer comprises a glass layer, and wherein one surface of the wafer comprises a silicon layer.

6. A semiconductor device singulation method according to claim 1, wherein the first kerf is sawn to a depth within the range of more than about ⅓ of the wafer thickness and less than about ¾ of the wafer thickness; and
    wherein the second kerf is sawn to a depth within the range of more than about ⅙ of the wafer thickness and less than about ¼ of the wafer thickness.

7. A semiconductor device singulation method according to claim 1, wherein the wafer comprises a multilayer structure approximately 3 mm in thickness; and
    wherein the first kerf is within the range of more than about 1 mm and less than about 2.25 mm in depth; and
    wherein the second kerf is with the range of more than about 0.5 mm and less than about 0.75 mm in depth.

8. A saw blade for semiconductor wafer device singulation comprising:
    a diamond disc suitable for high-speed rotation about its axis;
    an annular gutter on each of the opposing planes of the disc, the gutters positioned symmetrically about the circumference of the disc.

9. A saw blade for semiconductor device singulation according to claim 8 further comprising a radiused cutting edge.

10. A saw blade for semiconductor device singulation according to claim 8 further comprising an approximately parabolic radiused cutting edge.

11. A saw blade for semiconductor device singulation according to claim 8 further comprising a wedge-shaped radiused cutting edge.

12. A saw blade for semiconductor device singulation according to claim 8 further comprising a set-back between the gutter and the cutting edge of the disc.

13. A saw blade for semiconductor wafer device singulation according to claim 8 wherein the gutter depth is equal to approximately 5% of the disc width.

14. A saw blade for glass-bonded semiconductor device singulation according to claim 8 wherein the gutter depth is within the range of approximately 2-10% of the disc width.

15. A saw blade for semiconductor device singulation according to claim 8 wherein the disc is approximately 0.01 inches in width and wherein the gutter depth is approximately 0.0005 inches.

16. A saw blade for semiconductor device singulation according to claim 8 further comprising a resin-bonded diamond disc.

17. A saw blade for semiconductor wafer singulation according to claim 8 further comprising a metallized diamond disc.

* * * * *